(12) United States Patent
Isaksen et al.

(10) Patent No.: US 6,510,188 B1
(45) Date of Patent: Jan. 21, 2003

(54) ALL DIGITAL AUTOMATIC GAIN CONTROL CIRCUIT

(75) Inventors: David Bruce Isaksen, Mountain View, CA (US); Byron Esten Danzer, Aptos, CA (US)

(73) Assignee: Wideband Computers, Inc., Mountain View, CA (US)

( * ) Notice: Subject to any disclaimer, the term of this patent is extended or adjusted under 35 U.S.C. 154(b) by 16 days.

(21) Appl. No.: 09/917,028

(22) Filed: Jul. 26, 2001

(51) Int. Cl.[7] ............................................. H04L 27/08
(52) U.S. Cl. ................. 375/345; 455/234.1; 455/245.1; 330/254
(58) Field of Search ....................... 375/345; 455/234.1, 455/245.1; 330/278, 254

(56) References Cited

U.S. PATENT DOCUMENTS 5,617,060 A * 4/1997 Wilson et al. ............ 455/239.1
5,784,410 A * 7/1998 Nakano ....................... 375/345

* cited by examiner

Primary Examiner—Temesghen Ghebretinsae
(74) Attorney, Agent, or Firm—Boris G. Tankhelevich

(57) ABSTRACT

A digital automatic gain control (AGC) system comprising an AGC amplifier configured to scale an input signal by a scale factor, and configured to generate an analog scaled input signal. An analog-to-digital (A/D) converter is configured to sample and convert the analog scaled input signal into a digital scaled input signal. The frequency down converted digital scaled input signal is processed by a power level detector circuit to detect its power level. The logarithmic comparison circuit (LCC) is configured to compare the detected power level of the digital scaled input signal to a predetermined reference signal and configured to generate a digital error signal. Finally, an error processing circuit is configured to process the digital error signal and configured to determine the scale factor of the AGC circuit. The test results show that for any applicable QAM constellation the AGC circuit of the present invention can control the broadest fades (or decreases) in the power level of the input signal with an accuracy up to 200 dB/per second.

22 Claims, 8 Drawing Sheets

FIG._2 *(PRIOR ART)*

Phasor Arrangement Including Minimum Bit Error Rate (BER)

Fast Attack and Slow Decay

ALL DIGITAL AUTOMATIC GAIN CONTROL CIRCUIT

BACKGROUND OF THE INVENTION

1. Field of the Invention

The present invention relates to automatic gain control (AGC) circuits, or more specifically, to digital AGC circuits designed to process a plurality of signals including burst signals.

2. Discussion of the Prior Art

In a radio receiver it is necessary to regulate the amplitude of the input signal for varying input signal levels. For instance, if the transmission line is capable of transmitting burst signals, it is possible that a receiver is required to receive a 1 $\mu$V signal at one time (when there is no burst signals in the transmission line), and a 1 V signal, a signal six orders of magnitude higher (if there is a burst signal in the transmission line) at another time. Since both signals should produce the same output level, an adjustment range of more than 110 dB may be required. The problem is made more difficult because most of the amplifier stages in the receiver, and certainly the A/D converter, often have a dynamic range less than the total range of signal strength variations which should be accommodated by the receiver. The prior art solution to this problem is to implement in a receiver a conventional automatic gain control function (AGC) of the input signal that allows the receiver to turn down the gain in various parts of the receiver rather than at a single point.

For instance, the AGC function can be implemented in such a way that for a fairly weak signal, the gain is decreased near the A/D converter end of the receiver, and the maximum gain is retained at the receiver front end and at the intermediate frequency (IF) circuit to maintain the best overall noise figure. On the other hand, for stronger input signals, the gain is decreased prior to the A/D and also at some of the intermediate stages as well to maximize the signal-to-noise ratio (SNR).

More specifically, in a conventional AGC circuit, a quasi-synchronization block receives an intermittently transmitted burst modulated signal (IF input signal) for quasi-synchronization demodulation with orthogonal carrier wave signals which are substantially equal in frequency to the carrier wave frequency to obtain two quadrature channels of analog type. A/D converters convert the two output signals from the quasi-synchronization demodulator into respective digital data series consisting of a plurality of bits. The digital data series obtained by the A/D converters are applied to a multiplier. The output of the multiplier is supplied to a demodulator using a DSP (Digital Signal Processor), and also to square circuits. The received signal level is obtained by squaring the respective outputs of the multiplier. The received signal level of the data series obtained by the squaring circuits are added together in an adder to obtain the received signal power of the outputs of the multiplier. A substracter subtracts an output signal level of the adder from the reference value to be set by the AGC loop. The difference value of the output of the substracter is multiplied by a multiplier with a loop gain constant k which determines the AGC loop gain, and the multiplied result is applied to an integrator. The integrator integrates the output of the multiplier and drives the multiplier. The AGC loop is thus established in order to minimize the output value of the substracter.

In the AGC loop, the AGC response time is determined by the loop gain constant k; the response time becomes shorter with the greater gain constant k and becomes longer with the lesser loop gain constant k.

In the conventional AGC circuit for burst signal, it has been generally necessary to decrease the response time of the loop to cope with the burst signal. However, since decreasing the loop response time is equivalent to increasing the loop band, the received level variation components that are superimposed on the received signal also pass through the loop. Such components are coupled to the received signal in the multiplier, thus deteriorating the signal quality. For this reason, there is a limit imposed on the response time for coping with the burst signal.

This problem is exacerbated in a system that deals with multilevel burst signals, for instance, in a QAM modem that should be capable of processing QAM burst signals without deterioration of the signal quality.

What is needed is a digital AGC circuit with a variable response time constant, that is capable of a high quality demodulation of multilevel burst signals, for instance, QAM burst signals.

SUMMARY OF THE INVENTION

To address the shortcomings of the available art, the present invention provides an all digital AGC circuit that implements an automatic gain control function in the QAM digital systems, including QAM modems, that deals with input burst signals including QAM burst signals having at least two maximums (two peaks).

One aspect of the present invention is directed to an all digital automatic gain control (AGC) system that digitally processes the multilevel input burst signal.

In one embodiment, the AGC system of the present invention comprises: an AGC amplifier, an analog-to-digital (A/D) converter, a frequency down converter, a complex lowpass filter (LPF), a power level detector circuit, a logarithmic comparison circuit (LCC), and an error processing circuit. The AGC amplifier is configured to scale an input signal by a scale factor that depends on the amplitude of the input signal, and configured to generate an analog scaled input signal.

In one embodiment, the (A/D) converter is configured to sample and convert the analog scaled input signal into a digital scaled input signal. The complex LPF is configured to filter out at least one image of the digital scaled input signal due to sampling, is configured to limit noise, and is configured to generate an inphase component I of the digital scaled input signal, and a quadrature component Q of the digital scaled input signal. The power level detector circuit is configured to detect a power level of the digital scaled input signal, wherein the LCC is configured to compare the detected power level of the digital scaled input signal to a predetermined reference signal and configured to generate a digital error signal. The error processing circuit is configured to process the digital error signal and configured to determine the scale factor. Finally, the scale factor is used by AGC amplifier to scale the incoming input signal.

In one embodiment, the error processing circuit further comprises: a coefficient damp multiplier, a digital integrator circuit, and a means for converting the digital error signal into an analog error signal. The coefficient damp multiplier is configured to multiply the digital error signal by at least one damping factor, wherein the digital integrator circuit is configured to digitally control at least one predetermined AGC loop time constant.

In one embodiment, the means for converting the digital error signal into the analog error signal further includes a digital-to-analog (D/A) circuit configured to convert the digital error signal into an analog error signal. In an alternative embodiment, the means for converting the digital error signal into the analog error signal further includes a pulse-width modulator.

In one embodiment, the coefficient damp multiplier further comprises a plurality of shift circuits, wherein each shift circuit is configured to implement at least one bit of the digital error signal.

In one embodiment, the digital integrator circuit further comprises an accumulator circuit, and a digital integrator feedback loop circuit. The accumulator circuit is configured to implement each predetermined AGC loop response time (or AGC loop time constant). The accumulator circuit comprises a clipping circuit configured to damp accumulation of the digital error signal in order to limit an upper signal power limit, and to limit a lower signal power limit. In one embodiment, the clipping circuit further comprises a minimum value hard decision logic circuit, and a maximum value hard decision logic circuit.

Another aspect of the present invention is directed to a method for automatically and digitally controlling a gain of a digital system depending on an amplitude of an input signal. In one embodiment, the method of the present invention comprises the following steps: scaling the input signal by a scale factor; generating an analog scaled input signal; sampling, converting the analog scaled input signal into a digital scaled input signal, and frequency down converting the digital scaled input signal; filtering out at least one image of the digital scaled input signal due to sampling, limiting noise, and generating an in phase component I and a quadrature component Q of the digital scaled input signal; detecting a power level of the digital scaled input signal; comparing the power level of the digital scaled input signal to a predetermined reference signal and generating a digital error signal by using a logarithmic comparison circuit (LCC); processing the digital error signal and determining the scale factor by utilizing an error processing circuit; and closing a feedback AGC loop by using the scale factor in the first step to scale the incoming input signal.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF THE PREFERRED AND ALTERNATIVE EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The effect of automatic gain adjustment, or variance control, on a data-dependent signal conditioning system, like QAM modems, is the normalization of the probability density function of the input waveform. The normalized probability density function of the input waveform keeps an input signal at nominal level, so that the rest of the QAM modem circuitry having a limited dynamic range, like a clock recovery circuit, an equalization circuit, or a carrier recovery circuit, can operate at optimal level.

Figure 1:
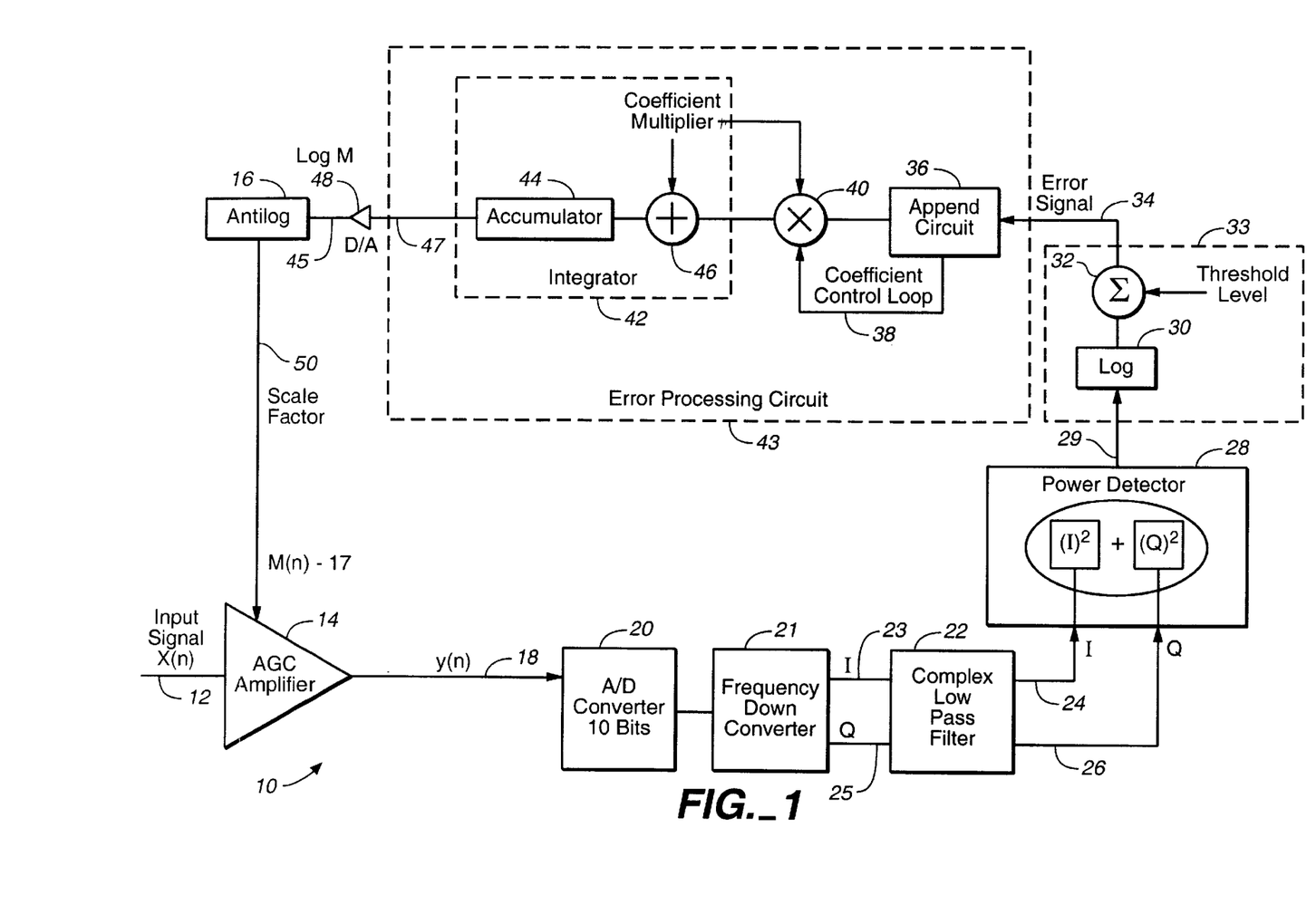
FIG. 1 depicts the basic block diagram of an automatic gain control (AGC) regulating circuit of the present invention.

Assuming that the gain is controlled at a single point, the block diagram of an AGC regulating circuit of the present invention is shown in FIG. 1. The AGC amplifier 14 is configured to scale an incoming input signal 12 by a scale factor M(n) 17, and is configured to generate an analog scaled input signal 18. An analog-to-digital (A/D) converter 20 is configured to sample and convert the analog scaled input signal 18 into a digital scaled input signal 21. In the preferred embodiment, the analog-to-digital (A/D) converter 20 comprises a 10 bit (A/D) converter.

According to Nyquist's fundamental theorem, the sampling frequency should be equal to or higher than twice the bandwidth B, that is $f_c \geq 2B$. If this condition is met, the original bandlimited signal can be recovered from its (½B)-spaced sampled representation with the aid of a low-pass filter having a cut-off frequency of B.

For instance, most of the energy of a voice signal is concentrated at frequencies below 4 kHz, and hence speech signals are typically lowpass filtered to 4 kHz. As a result, a sampling rate of 8 kHz or higher is required in order to accurately reconstruct such a signal. In practice, most voice communication systems use a sampling rate of 8 kHz.

Figure 2:
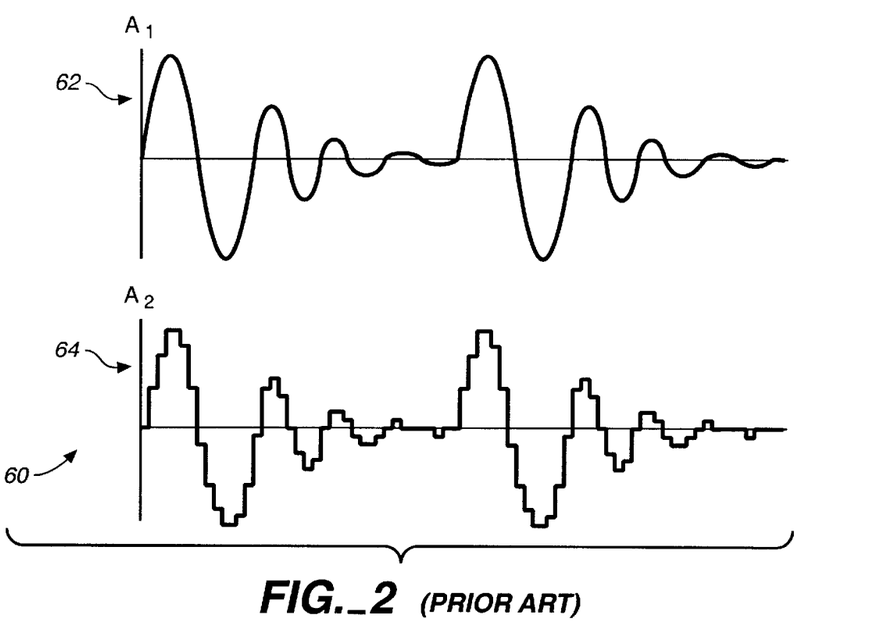
FIG. 2 illustrates the action of the A/D converter that converts an analog signal into its digitized counterpart using only a small number of quantized bits.

The analog-to-digital converter (A/D) (20 of FIG. 1) takes the scaled analog bandlimited signal y(n) 18 and digitizes it by converting the analog level of each sample to a discrete level. For example, in an 10-bit A/D each discrete level is represented by ten binary output bits. Thus, the scaled digital signal 21 has a resolution of 1024 distinct digital levels. FIG. 2 illustrates the action of the A/D that converts an analog signal into its digitized counterpart using only a small number of quantized bits. However, the scaled digital signal 21 includes at least one image due to sampling that has to be filtered out after the frequency down conversion operation performed by block 21. This is one of the functions performed by a complex lowpass filter (LPF) 22. The LPF filter 22 also limits noise, and generates an inphase I component 24 of the digital scaled input signal 21, and a quadrature Q component 26 of the digital scaled input signal 21.

Figure 3:
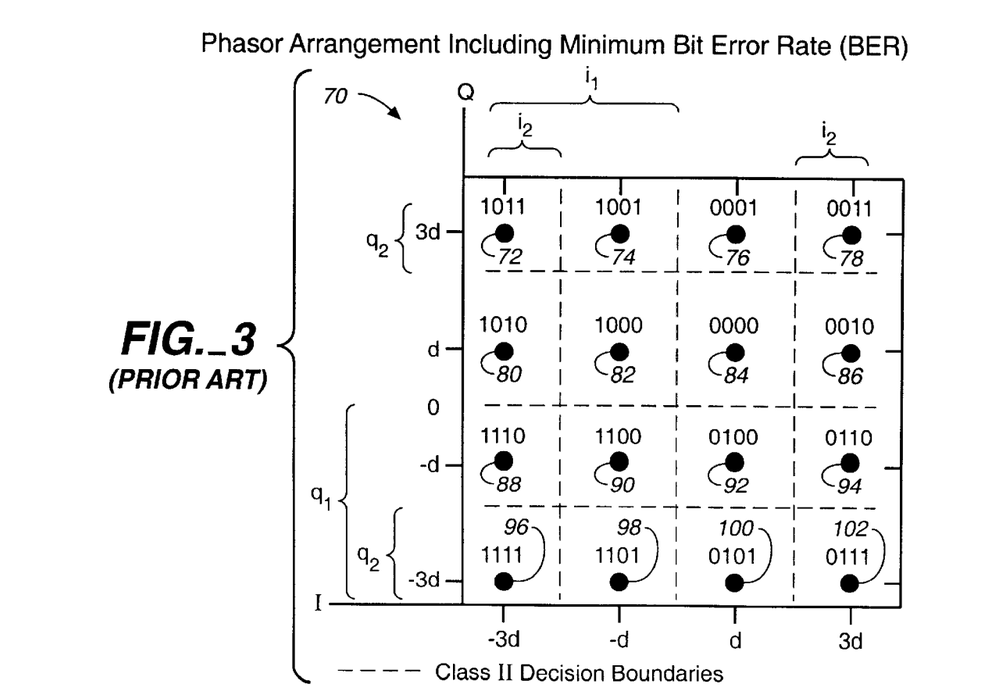
FIG. 3 shows the digital scaled input signal that includes a 16-QAM square constellation, wherein each element (phasor) is represented by a four-bit symbol comprising the in-phase bits (i1, i2) and quadrature bits (q1, q2) which are interleaved to yield the sequence (i1, q1, i2, q2).

FIG. 3 depicts a digital scaled input signal 21 that includes a 16-QAM square constellation 70, wherein each element (phasor) (72–102) is represented by a four-bit symbol comprising the in-phase bits (i1, i2) and quadrature bits (q1, q2) which are interleaved to yield the sequence (i1, q1, i2, q2). To maximize the average energy of the phasors, quaternary quadrature components I and Q are Gray encoded by assigning the bits 01, 00, 10, and 11 to the levels 3d, d, –d, and –3d, respectively.

For the geometry of FIG. 3, the average transmitted energy is as follows:

$$E_0 = (2d^2 + 2 \times 10d^2 + 18d^2)/4 = 10 \times d^2. \qquad (1)$$

For any other phasor arrangement the average energy will be less and the signal to noise ratio (SNR) required to achieve the same bit error rate (BER) will be higher.

Figure 4:
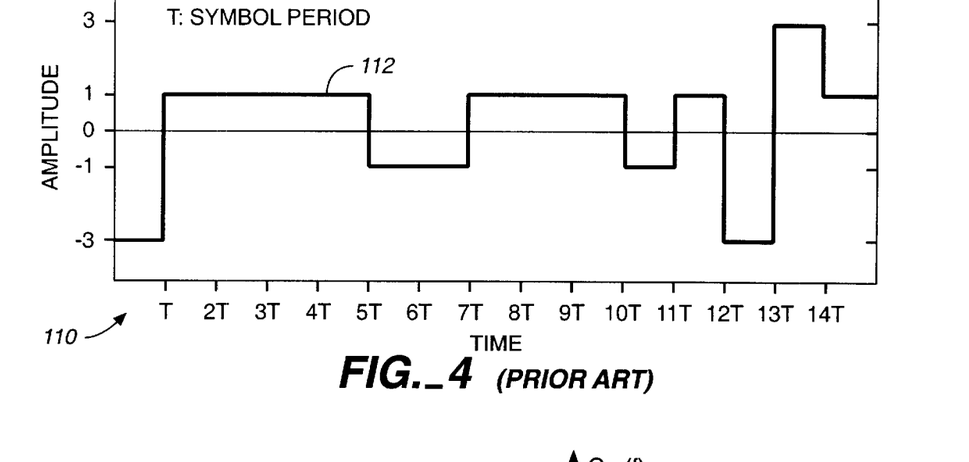
FIG. 4 is a plot of a typical quaternary I component sequence generated by mapping the input data using the constellation diagram of FIG. 3.

FIG. 4 is a plot of a typical quaternary I component sequence generated by mapping the input data using the constellation diagram 70 of FIG. 3. Due to the instantaneous transitions in the time domain the I-sequence 110 has an infinite bandwidth and would require an infinite channel bandwidth for its transmission. The same is true for the Q-component (not shown). Thus, the I and Q signals should be bandlimited in order to contain the spectrum within a limited band and to minimize interference with other users or systems sharing the spectrum.

Figure 5A:
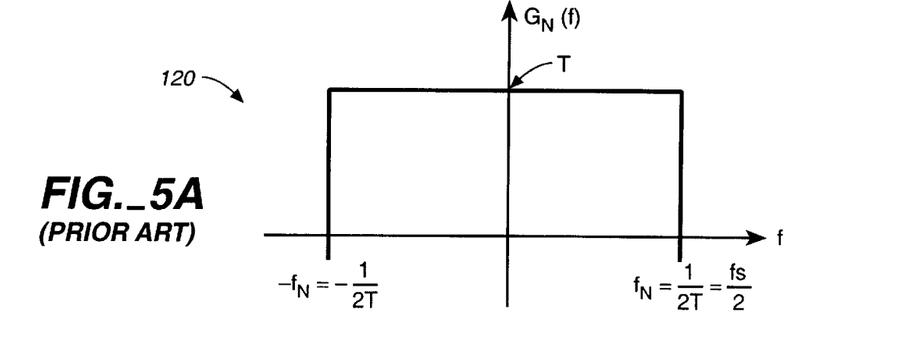
FIG. 5A depicts the ideal transfer function, or Nyquist characteristic, of the complex LPF filter.
Figure 5B:
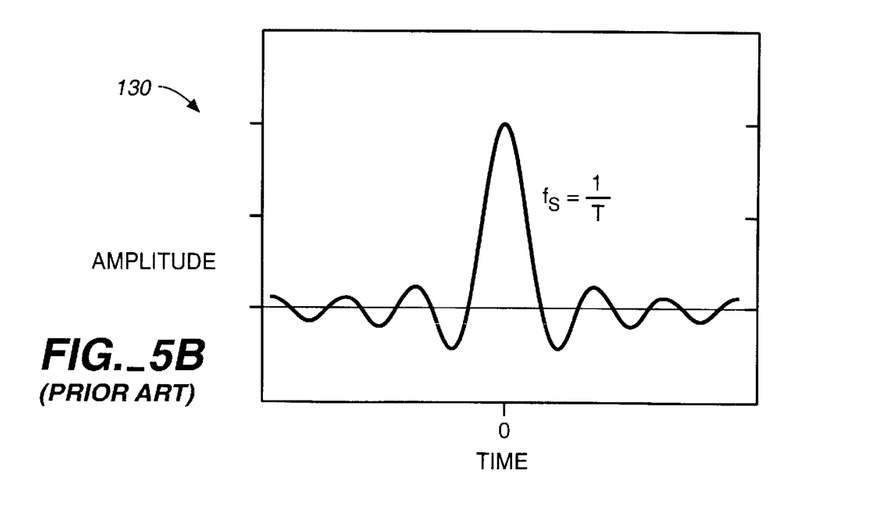
FIG. 5B shows an impulse response characteristic of LPF filter having an ideal transfer function shown in FIG. 5A.

An ideal complex LPF filter (22 of FIG. 1) with a cut-off Nyquist frequency of $f_N = f_S/2$, wherein $f_S = 1/T$ is the signaling frequency, and T is the signaling interval duration, would transform the frequency down converted scaled digital signal 21 into two components in I 24 and Q 26 channels while retaining all the information within a compact frequency band. Due to the linear phase response of the ideal complex LPF filter all frequency components would exhibit the same group delay. The ideal LPF complex filter 22 of FIG. 1 has an ideal transfer function, or Nyquist characteristic, shown as a rectangular curve 120 in FIG. 5A, and an impulse response characteristic 130 shown in FIG. 5B.

Figure 6A:
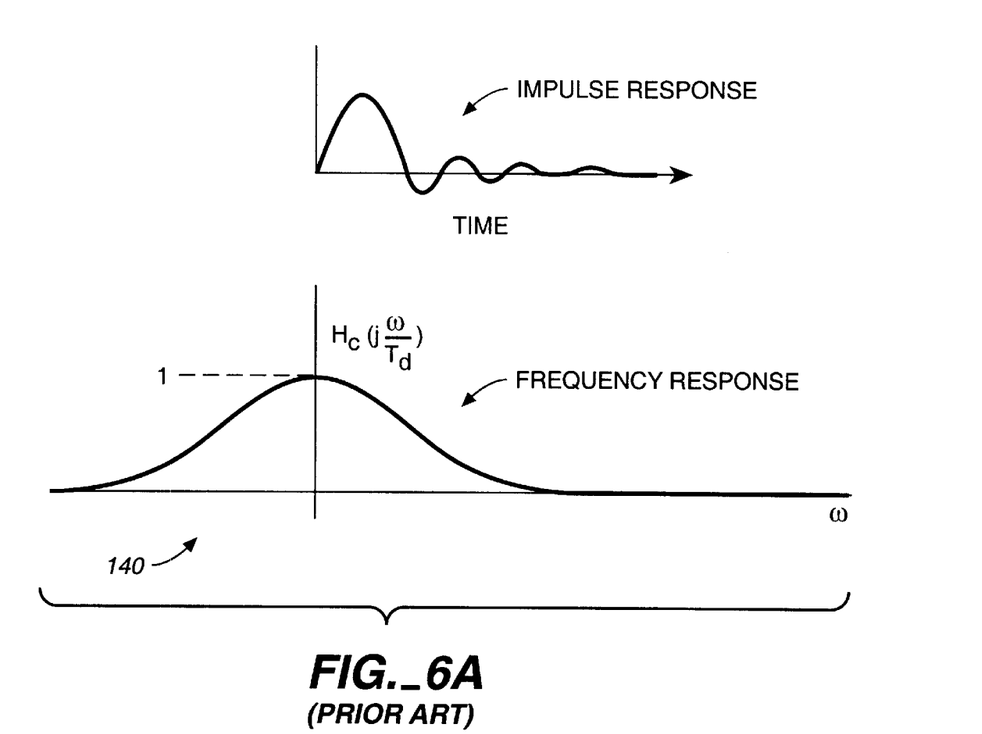
FIG. 6A illustrates a lowpass filter (LPF) implemented as an infinite impulse response (IIR) filter.
Figure 6B:
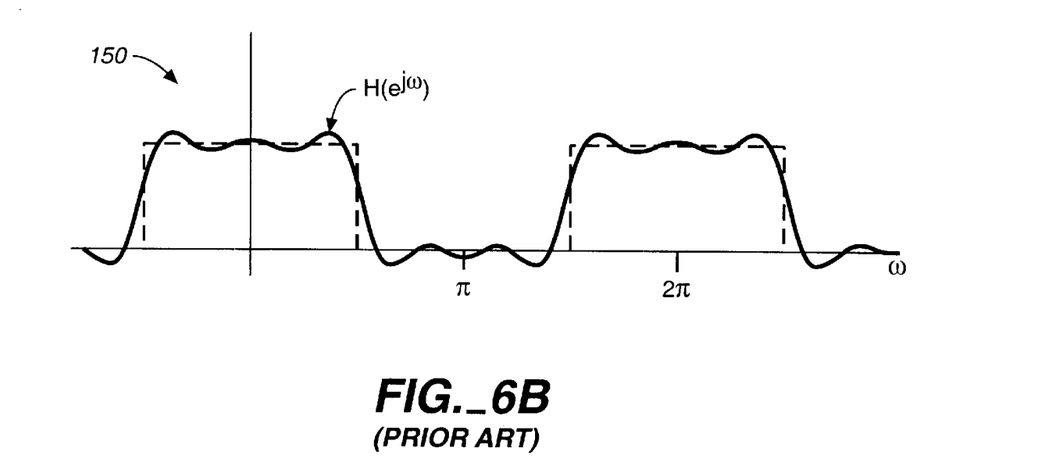
FIG. 6B shows LPF filter implemented as a finite impulse response (FIR) filter.

All lowpass filters (LPF), like an infinite impulse response (IIR) filter, shown as 140 in FIG. 6A, or a more practical finite impulse response (FIR) filter, shown as 150 in FIG. 6B, have impulse responses with non-zero values at the equi-spaced sampling instants, introduce ISI, and degrade the BER performance.

Referring back to FIG. 1, the instantaneous power level detector block 28 is configured to detect an instantaneous power level of the scaled input digital signal 21 and to calculate a power function $(I^2 + Q^2)$ 29.

The logarithmic comparison circuit (LCC) 33 is configured to compare $\{\log(I^2 + Q^2)\}$ to log of the target predetermined reference signal R in the substracter block 32, and configured to generate a digital error signal 34. The Log block 30 estimates the power level detector output signal 29 as a binary argument number. Using the target reference signal R (instead of a prior art peak detector that can detect only a signal having a single maximum) allows the AGC circuit of the present invention to deal with multi-level signals.

Figure 7:
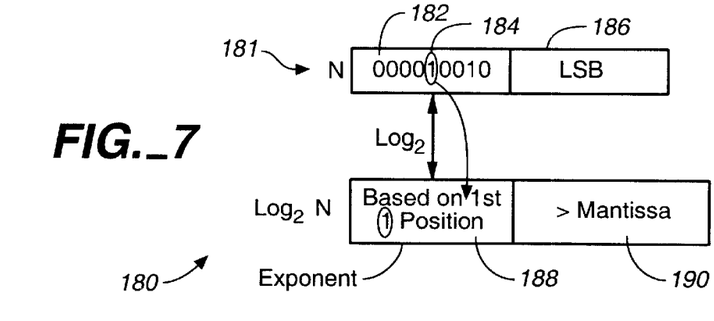
FIG. 7 illustrates a general idea how to numerically obtain the exponent value of $\{\log (I^2+Q^2)]$ minus log [target reference number R]} in the LCC circuit.
Figure 8:
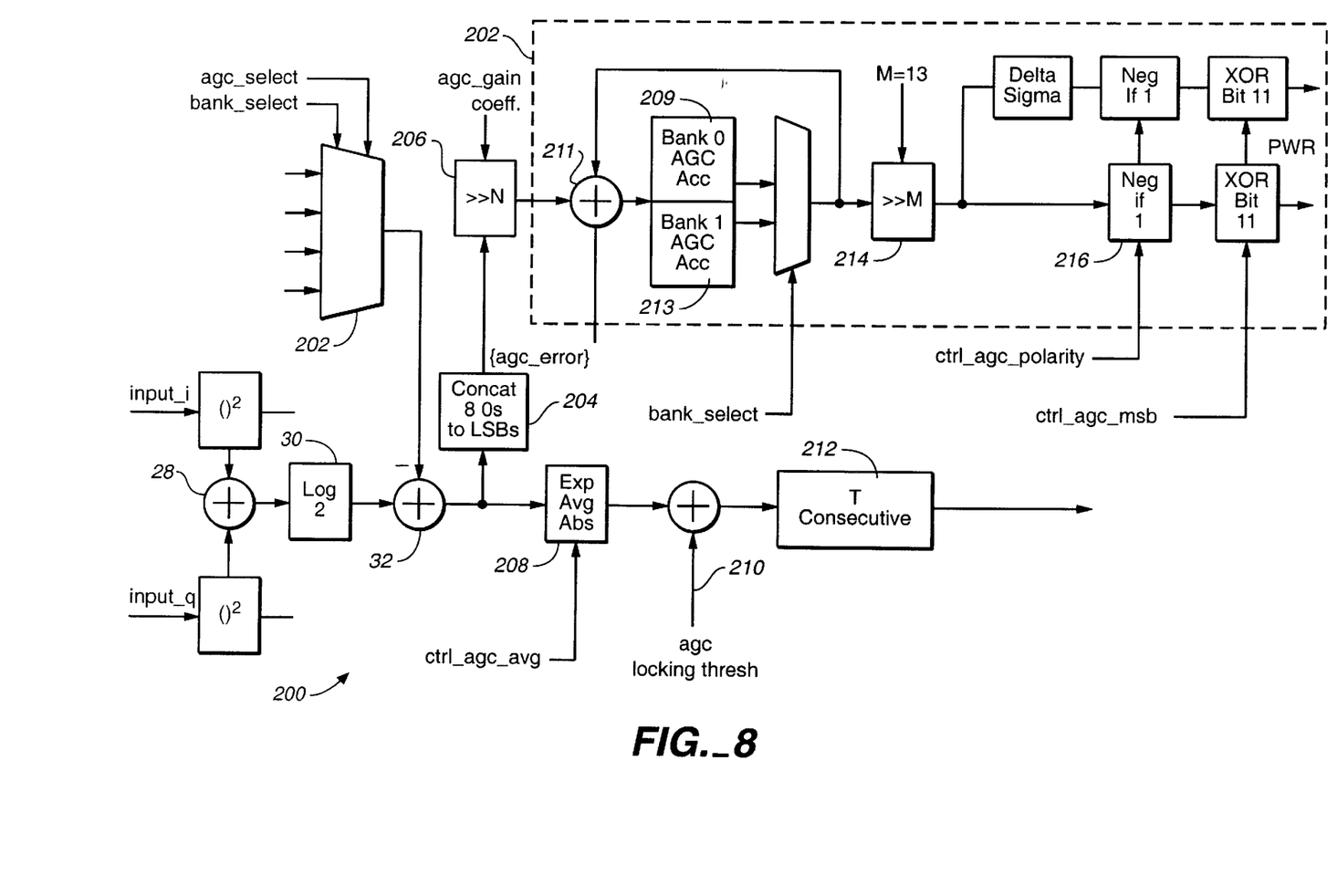
FIG. 8 is a detailed illustration of the main blocks of the all digital AGC system of the present invention.

FIG. 7 illustrates a general idea how to numerically obtain the exponent value of $\{\log(I^2 + Q^2) \text{ minus } \log [\text{target reference number R}]\}$ in the LCC. FIG. 8 depicts the detailed implementation of the AGC system of the present invention. The block 202 (of FIG. 8) shows how to input different predetermined reference numbers $R_i$ into the substracter block 32 using a bank of different predetermined $R_i$ reference numbers, wherein 'i' is an integer.

After the Most Significant/Leftmost digit "1" 182 of the binary argument number is found, an exponent output of the LCC 188 is assigned to this Most Significant/Leftmost digit "1" 182 of the binary argument number.

In order to obtain the mantises of the binary argument number of the LCC input binary number N 181, as shown in FIG. 8, the following operations can be performed. At first, the binary argument number N can be concatenated by a mask number having a predetermined number of bits, as shown in block 204. Next, the binary argument number is shifted by the mask number having the predetermined number of bits, as illustrated by the block 206. In one embodiment, the mantises of the LCC is obtained as the predetermined number of shifted bits of the binary argument number. In this embodiment, the approximation number of the LCC is obtained by concatenating the exponent and the mantises. In one embodiment, in order to obtain the necessary dynamical range of the LCC, the mask number is equal to 7-bit number, and the approximation number of the LCC includes the mantises obtained with a 6-bit accuracy.

Thus, in one embodiment of the present invention, the function of LCC block $\{\log(I^2 + Q^2) \text{ minus } \log [\text{target reference number R}]\}$ is implemented by using the following algorithm:

1. get the power power $(I^2 + Q^2)$;
2. search for the Most Significant/Leftmost digit "1" 182 of the error signal that is equal to $\{\log(I^2 + Q^2) \text{ minus } \log [\text{target reference number R}]\}$ by using the following operations:
   a. shift;
   b. compare with Zero;
   c. if the result is non-Zero, repeat shift;
   d. if the result is Zero, get the exponent;

e. get 6 bit of mantises by using the masking by 7-bit of the original shift number; and f. concatenate exponent and mantises.

(2)

As was mentioned above, the A/D converter (20 of FIG. 1) processes an analog sinusoidal scaled signal 18 and generates a digital scaled signal 21 having a single level with up to 10-bit accuracy. For a 10-bit voltage level we have a 20-bit power level. However, in the AGC system of the present invention, the Log function block is approximated only up to 6 digits after the Most Significant/Leftmost digit "1" in mantises. Thus, the difference in signal powers for two QAM signals with a single LSB change is less than 1%. However, the AGC system of the present invention still captures and eliminates even this small difference in signal powers by using a damping multiplier having a bank of different damping factors in the AGC loop.

Figure 9:
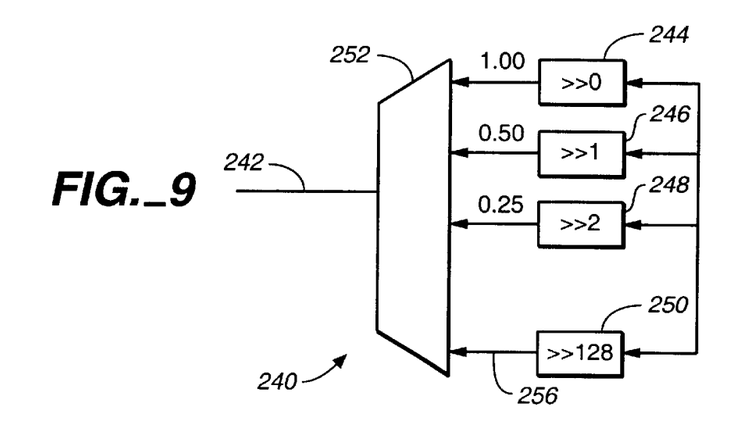
FIG. 9 shows the implementation of the coefficient damp multiplier comprising a plurality of shift circuits.

Referring still to FIG. 1, the digital error signal 34 (of FIG. 1) generated by the LCC circuit 33 (of FIG. 1) is further processed by the error processing circuit 43 (of FIG. 1). In one embodiment of the present invention, the error processing circuit (43 of FIG. 1, or 202 of FIG. 8) further comprises a coefficient damp multiplier 40 that is configured to multiply the digital error signal 34 by at least one damping factor. In the preferred embodiment, as shown in FIG. 9, the coefficient damp multiplier 240 further comprises a plurality of shift circuits 244, 246, 248, . . . , 250. Indeed, the shift circuit 244 implements the Most Significant Bit of the scaled digital error signal, the shift circuit 246 implements the Next Most Significant Bit of the scaled digital error signal, and so on. Thus, different damp factors can be selected by using different combinations of shift circuits 244, 246, 248, . . . , 250 depending on the properties of the signals that propagate through the AGC system. Thus, the jitter oscillations caused by the propagation of the burst multi-level signal through the AGC system can be eliminated by selecting the proper damping factor.

The error processing circuit further includes a digital integrator circuit (42 of FIG. 1, or 207 of FIG. 8) configured to digitally control at least one predetermined AGC loop time constant, and a means for converting the digital error signal into an analog error signal. In one embodiment of the present invention, the means for converting the digital error signal into the analog error signal further includes a digital-to-analog (D/A) circuit 48 configured to convert the processed digital error signal 47 into an analog error signal 49. In an alternative embodiment of the present invention, the means for converting the digital error signal into the analog error signal further includes a pulse-width modulator (not shown).

In one embodiment, the digital integrator circuit 42 (207 of FIG. 8) further comprises an accumulator circuit 44 (209 of FIG. 8) and a digital integrator feedback loop circuit including an adder 46 (211 of FIG. 8). A variable time constant of the digital integrator circuit 42 (207 of FIG. 8) determines the variable AGC time loop constant. The goal is to achieve a fast attack and a slow decay phases of the AGC circuit by selecting the parameters of the digital integrator circuit 42 (207 of FIG. 8). This results in dynamically changing the AGC time loop constant, and in dynamically adjusting the scale factor M(n).

Figure 10:
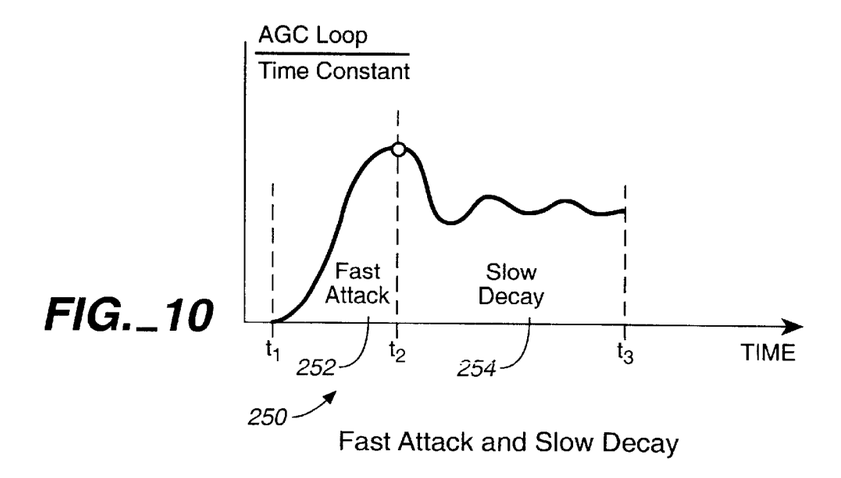
FIG. 10 illustrates two phases of the signal acquisition by the AGC circuit of the present invention.

FIG. 10 illustrates two phases {the fast attack phase 252 within the time interval t1<t<t2, and the slow decay phase 254 within the time interval t2<t<t3} of the signal acquisition by the AGC circuit of the present invention. In one embodiment of the present invention, the criteria for switching between $bank_0$ of AGC accumulator coefficients (209 of FIG. 8) and $bank_1$ of AGC accumulator coefficients (211 of FIG. 8) is as follows:

$$\text{bank of } AGC \text{ accumulator coefficients} = \quad (3)$$

$$\begin{cases} bank_0 \text{ of } AGC \text{ accumulator coefficients, if } t1 < t < t2, \\ bank_1 \text{ of } AGC \text{ accumulator coefficients, if } t2 < t < t3. \end{cases}$$

The goal is to achieve different AGC loop time constants for different magnitudes of error signals. The lesser AGC loop time constants is desirable for large error signals, wherein the larger AGC loop time constants is wanted for small error signals. Indeed, the fast damping of small error signals will complicate the time and carrier recovery in the remainder of the QAM modem circuitry, wherein the digital AGC circuit (the subject of the present invention) is placed in the front end.

Figure 11:
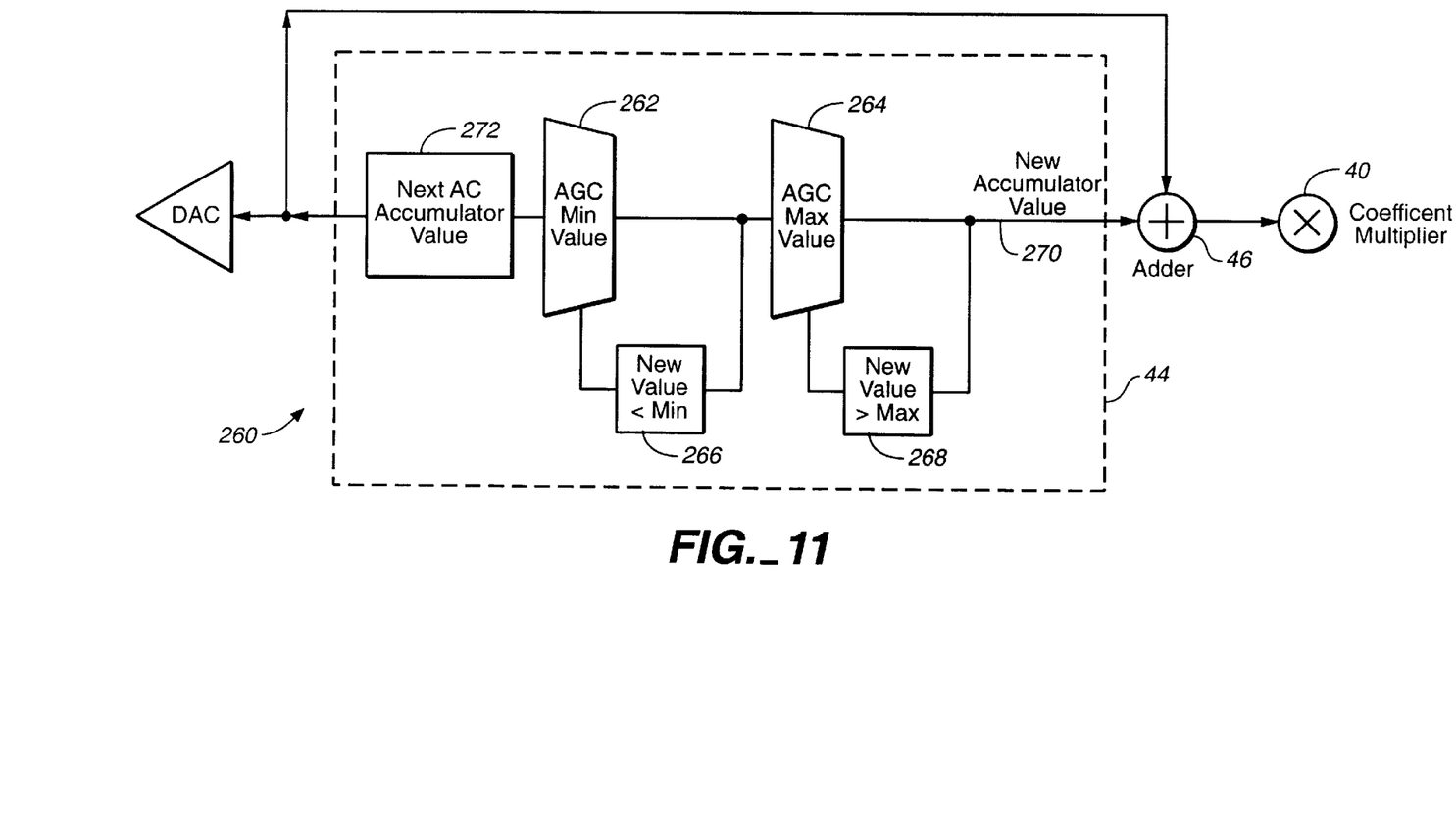
FIG. 11 depicts the accumulator circuit of FIG. 1 further comprising a clipping circuit further comprising a minimum value hard decision logic circuit and a maximum value hard decision logic circuit.
Figure 12:
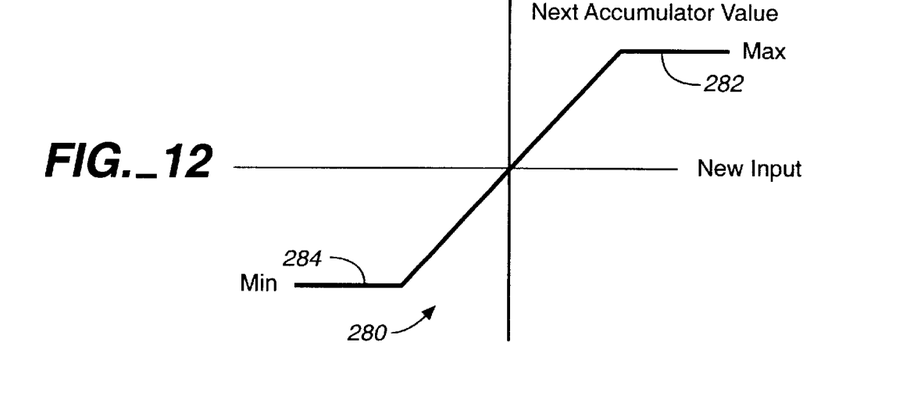
FIG. 12 illustrates the clipping circuit function including an upper signal power limit by {MAX block new accumulator value} and a lower signal power limit by {MIN block new accumulator value}.

In one embodiment of the present invention, as depicted in FIG. 11, the accumulator circuit 44 (of FIG. 1) further comprises a clipping circuit 260 further comprising a minimum value hard decision logic circuit 262 and a maximum value hard decision logic circuit 264. The clipping circuit 260 is configured to damp accumulation of the digital error signal in order to limit an upper signal power limit by {MAX block new accumulator value} 268, and to limit a lower signal power limit by {MIN block new accumulator value} 266. FIG. 12 further illustrates the clipping circuit function 280. Without the clipping circuit even if there is no input signal, the error signal would start accumulate and gain of the AGC circuit would go to minimum. The clipping circuit allows the AGC circuit to have a constant gain when there is no input signal.

The large shift in the {MAX block new accumulator value} 268, like 7-bit shift, would get rid of all 6 digits in logarithm comparison circuit LCC (33 of FIG. 1) and would also take one bit from exponent. This would result in limiting the error signal so that digital integration circuit 42 (of FIG. 1 ) would not react on a small error signal. As a result, the more AGC jitter would occur.

Figure 13:
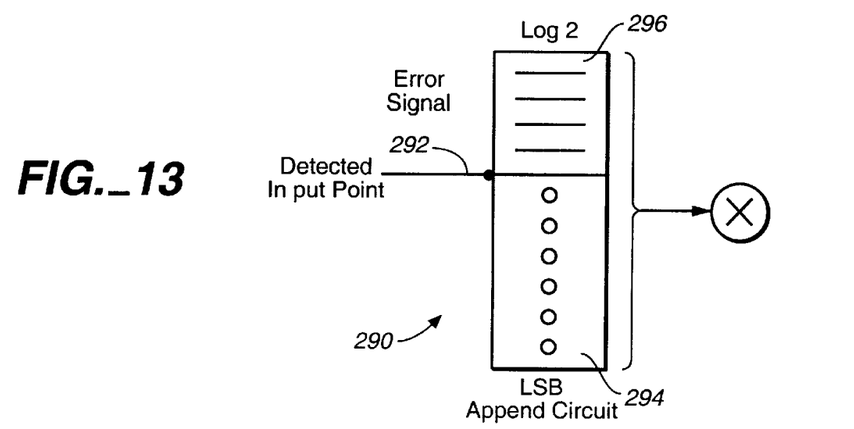
FIG. 13 depicts the LCC further including an append circuit configured to extend a plurality of error registers to include a plurality of least significant bits (LSB) of the digital error signal.

In one embodiment of the present invention, as shown in FIG. 13, to prevent this kind of situation from happening, the LCC circuit (33 of FIG. 1) further comprises an append circuit 290 configured to extend a plurality of error registers 296 to include a plurality of least significant bits (LSB) 294 of the digital error signal. This increases the accuracy of the error signal beyond the 6 digits in mantises, and therefore even a small error signal would cause the digital integration block 42 (FIG. 1) to perform, thus resulting in decreased jitter.

In one embodiment, the digital integrator circuit (207 of FIG. 8) further comprises a polarity control circuit 216 that utilizes a predetermined sign of a gain slope of the AGC amplifier in order to determine a control voltage value (equal to a maximum control voltage value minus an accumulated value).

Figure 14:
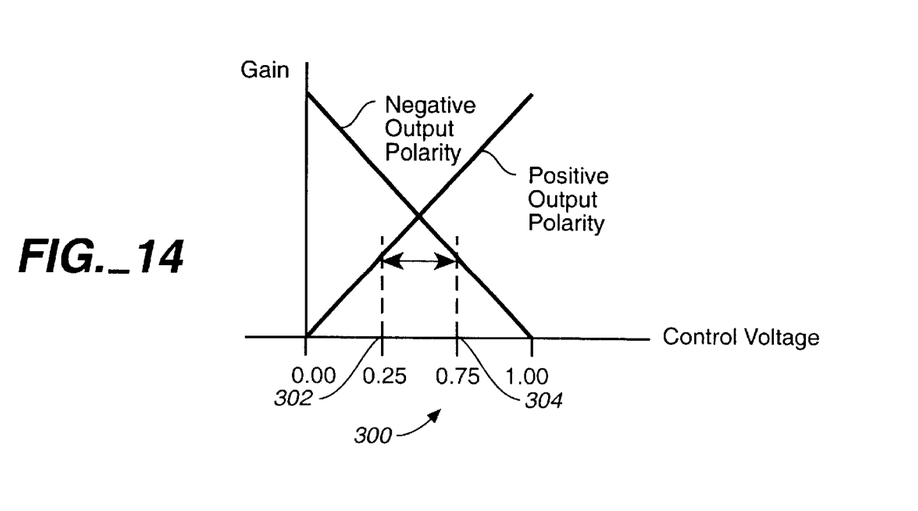
FIG. 14 is a plot of a curve that illustrates the two available output polarities control circuit algorithm.

FIG. 14 is a plot of a curve that illustrates the polarity control circuit 216 using the following algorithm:

if negative slope;
control voltage=max control voltage minus accumulated value;
else if positive slope;
control value=accumulated value.

(4)

That is, the control voltage value determines a control level of the AGC.

The error processing circuit 43 determines the logarithm of scale factor Log M(n) 49. The Antilog block 16 (of FIG.

1) calculates the scale factor M(n) and applies it to the AGC amplifier block 14 thus closing the AGC loop. If the power is too large, the scale factor M(n) is reduced; if the power is too small, the scale factor M(n) is increased.

The test results show that for any applicable QAM constellation the AGC circuit of the present invention can control the broadest fades (or decreases) in the power level of the input signal with an accuracy up to 200 dB/per second.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A digital automatic gain control (AGC) system having a system input and a system output, said circuit comprising:
    an AGC amplifier coupled to said system input, said AGC amplifier configured to scale an input signal by a scale factor, and configured to generate an analog scaled input signal;
    an analog-to-digital (A/D) converter coupled to said AGC amplifier, said (A/D) converter configured to sample and convert said analog scaled input signal into a digital scaled input signal;
    a frequency down converter coupled to said A/D converter, said frequency down converter configured to down convert in frequency said digital scaled input signal;
    a complex lowpass filter (LPF) coupled to said frequency down converter, said complex LPF configured to filter out at least one image of said digital scaled input signal due to sampling, configured to limit noise, and configured to generate an in phase component I of said digital scaled input signal, and a quadrature component Q of said digital scaled input signal;
    a power level detector circuit coupled to said complex LPF, wherein said power level detector circuit is configured to detect a power of said digital scaled input signal;
    a logarithmic comparison circuit (LCC) coupled to said power level detector circuit, wherein said LCC is configured to compare a log of said power of said digital scaled input signal to a predetermined reference signal and configured to generate a digital error signal; and
    an error processing circuit coupled to said LCC, wherein said error processing circuit is configured to process said digital error signal and configured to determine said scale factor;
    wherein a feedback AGC loop comprising said AGC amplifier, said analog-to-digital (A/D) converter, said frequency down converter, said complex lowpass filter (LPF), said power level detector circuit, said logarithmic comparison circuit (LCC), and said error processing circuit is closed when said scale factor is used by said AGC amplifier to scale said input signal.

2. The digital automatic gain control (AGC) system of claim 1, wherein said error processing circuit further comprises:
    a coefficient damp multiplier coupled to said LCC, wherein said coefficient damp multiplier is configured to multiply said digital error signal by at least one damping factor;
    a digital integrator circuit coupled to said coefficient damp multiplier, wherein said digital integrator circuit is configured to digitally control at least one predetermined AGC loop time constant; and
    a means for converting said digital error signal into an analog error signal.

3. The digital automatic gain control (AGC) system of claim 2, wherein said means for converting said digital error signal into said analog error signal further includes:
    a digital-to-analog (D/A) circuit coupled to said digital integrator circuit to convert said digital error signal into an analog error signal.

4. The digital automatic gain control (AGC) system of claim 2, wherein said coefficient damp multiplier further comprises:
    a plurality of shift circuits, wherein each said shift circuit is configured to implement at least one bit of said digital error signal.

5. The digital automatic gain control (AGC) system of claim 2, wherein said digital integrator circuit further comprises:
    an accumulator circuit; and
    a digital integrator feedback loop circuit;
    wherein said accumulator circuit is configured to implement each said predetermined AGC loop time constant.

6. The digital automatic gain control (AGC) system of claim 5, wherein said accumulator circuit further comprises:
    a clipping circuit further comprising:
        minimum value hard decision logic circuit; and
        a maximum value hard decision logic circuit;
    wherein said clipping circuit is configured to damp accumulation of said digital error signal in order to limit an upper signal power limit, and to limit a lower signal power limit.

7. The digital automatic gain control (AGC) system of claim 1, wherein said LCC further comprises:
    an append circuit configured to extend a plurality of error registers to include a plurality of least significant bits (LSB) of said digital error signal.

8. The digital automatic gain control (AGC) system of claim 2, wherein said digital integrator circuit further comprises:
    polarity control circuit coupled to said digital integrator feedback loop circuit;
    and wherein said polarity control circuit utilizes a predetermined sign of a gain slope of said AGC amplifier in order to determine a control voltage value equal to a maximum control voltage value minus an accumulated value;
    and wherein said control voltage value determines a control level of said AGC.

9. The digital automatic gain control (AGC) system of claim 2, wherein said digital integrator circuit further comprises:
    a number system control circuit configured to choose between an offset binary number system and a complementary number system to represent a digital input signal to said D/A converter.

10. A digital automatic gain control (AGC) system having a system input and a system output, said system comprising:
    a means for scaling an input signal by a scale factor and for generating an analog scaled input signal;

a means for sampling and converting said analog scaled input signal into a digital scaled input signal;

a means for frequency down converting said digital scaled input signal;

a means for filtering out at least one image of said digital frequency down converted scaled input signal due to sampling, for limiting noise, and for generating an in phase component I and a quadrature component Q of said digital scaled input signal;

a means for detecting a power of said digital scaled input signal;

a logarithmic comparison circuit (LCC) means for comparing a log of a power level of said digital scaled input signal to a predetermined reference signal and for generating a digital error signal; and an error processing means for processing said digital error signal and for determining said scale factor.

11. The digital automatic gain control (AGC) system of claim 10, wherein said error processing means further comprises:

a means for multiplying said digital error signal by at least one damping factor;

a means for digitally controlling at least one predetermined AGC loop time constant; and a means for converting said digital error signal into an analog error signal.

12. The digital automatic gain control (AGC) system of claim 11, wherein said means for multiplying said digital error signal by at least one damping factor further comprises:

a shift circuits means for implementing at least one bit of said digital error signal.

13. The digital automatic gain control (AGC) system of claim 11, wherein said means for digitally controlling at least one predetermined AGC loop time constant further comprises:

an accumulator circuit means for implementing each said predetermined AGC loop time constant; and a means for digitally integrating said error signal using each said predetermined AGC loop time constant.

14. The digital automatic gain control (AGC) system of claim 13, wherein said accumulator circuit means further comprises:

a clipping circuit means for damping accumulation of said digital error signal in order to limit an upper signal power limit, and to limit a lower signal power limit.

15. The digital automatic gain control (AGC) system of claim 10, wherein said logarithmic comparison circuit (LCC) means further comprises:

a means for estimating said power level of said output signal as a binary argument number of said LCC;

a means for searching a Most Significant/Leftmost digit "1" of said binary argument number of said LCC input binary number;

a means for assigning an exponent output of said LCC to said Most Significant/Leftmost digit "1" of said binary argument number;

a means for concatenating said binary argument number by a mask number having a predetermined number of bits;

a means for shifting said binary argument number by said mask number having said predetermined number of bits;

a means for obtaining a mantises of said LCC as said predetermined number of shifted bits of said binary argument number; and a means for concatenating said exponent and said mantises in order to obtain said approximation number of said LCC.

16. The digital automatic gain control (AGC) system of claim 15, wherein said means for concatenating said binary argument number by a mask number having a predetermined number of bits further includes:

a means for concatenating said binary argument number by a mask number equal to 7-bit number, wherein said approximation number of said LCC includes said mantises obtained with a 6-bit accuracy.

17. A method for automatically and digitally controlling a gain factor of a digital circuit by using a digital automatic gain control (AGC) system; said method comprising the steps of:

(A) scaling said input signal by a scale factor;

(B) generating an analog scaled input signal;

(C) sampling and converting said analog scaled input signal into a digital scaled input signal;

(D) frequency down converting digital scaled input signal;

(E) filtering out at least one image of said frequency down converted digital scaled input signal due to sampling, for limiting noise, and for generating an in phase component I and a quadrature component Q of said digital scaled input signal;

(F) detecting a power level of said digital scaled frequency down converted input signal;

(G) comparing a log of said power level of said digital scaled input signal to a predetermined reference signal and generating a digital error signal by using a logarithmic comparison circuit (LCC);

(H) processing said digital error signal and determining said scale factor by utilizing an error processing circuit; and (I) closing a feedback AGC loop by using said scale factor in said step (A) to scale said input signal.

18. The method of claim 17, wherein said step (H) of processing said digital error signal and determining said scale factor further comprises the steps of:

multiplying said digital error signal by at least one damping factor;

digitally controlling at least one predetermined AGC loop time constant; and converting said digital error signal into an analog error signal. signal.

19. The method of claim 18, wherein said step of digitally controlling at least one predetermined AGC loop time constant further comprises the steps of:

implementing each said predetermined AGC loop time constant by using an accumulator circuit; and digitally integrating said error signal using each said predetermined AGC loop time constant.

20. The method of claim 19, wherein said step of implementing each said predetermined AGC loop time constant further includes the step of:

damping accumulation of said digital error signal in order to limit an upper signal power limit, and to limit a lower signal power limit.

21. The method of claim 17, wherein said step (G) of comparing said log of said power level of said digital scaled input signal to said predetermined reference signal further comprises the steps of:

(G1) estimating said power level output signal as a binary argument number of said LCC;

(G2) searching a Most Significant/Leftmost digit "1" of said binary argument number of said LCC input binary number;

(G3) assigning an exponent output of said LCC to said Most Significant/Leftmost digit "1" of said binary argument number;

(G4) concatenating said binary argument number by a mask number having a predetermined number of bits;

(G5) shifting said binary argument number by said mask number having said predetermined number of bits;

(G6) obtaining a mantises of said LCC as said predetermined number of shifted bits of said binary argument number; and (G7) concatenating said exponent and said mantises in order to obtain said approximation number of said LCC.

22. The method of claim 21, wherein said step (G4) of concatenating said binary argument number by said mask number having said predetermined number of bits further includes the step of:

concatenating said binary argument number by a mask number equal to 7-bit number, wherein said approximation number of said LCC includes said mantises obtained with a 6-bit accuracy.

* * * * *